(12) United States Patent
Ohkawa et al.

(10) Patent No.: US 6,399,899 B1
(45) Date of Patent: Jun. 4, 2002

(54) SUSPENSION BOARD WITH CIRCUIT

(75) Inventors: Tadao Ohkawa; Yasuhito Ohwaki; Shigenori Morita; Toshihiko Omote, all of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/712,980

(22) Filed: Nov. 16, 2000

(30) Foreign Application Priority Data

Nov. 19, 1999 (JP) .......................................... 11-330484
Mar. 30, 2000 (JP) ........................................ 2000-092662

(51) Int. Cl.[7] .............................................. H01R 12/04
(52) U.S. Cl. .................... 174/261; 174/255; 174/262
(58) Field of Search ................................ 174/261, 260, 174/262, 255; 29/603.04; 360/101, 245.9; 361/772, 760; 438/108

(56) References Cited

U.S. PATENT DOCUMENTS 5,844,753 A * 12/1998 Inaba ........................ 360/245.9
5,857,257 A * 1/1999 Inaba ........................ 29/603.04
6,184,479 B1 * 2/2001 Okabe et al. ................ 174/262
6,217,987 B1 * 4/2001 Ono et al. ................... 174/255

* cited by examiner

Primary Examiner—Albert W. Paladini
(74) Attorney, Agent, or Firm—Kubovcik & Kubovcik

(57) ABSTRACT

To provide a suspension board with circuit that enables its terminals to be bonded to the other terminals with sufficient strength with simple structure, to ensure sufficient bonding reliability, the suspension board with circuit 11 includes a suspension board 12, a base layer 13 formed on the suspension board 12, and a conductive layer 14 formed on the base layer 13 and a cover layer 18 with which the conductive layer 14 is covered, wherein external connection terminals 17 to be bonded to terminals 28 of a read/write board 29 are formed without the suspension board 12 and/or the base layer 13 being formed.

4 Claims, 16 Drawing Sheets

SECTION TAKEN ALONG LINE A-A

SUSPENSION BOARD WITH CIRCUIT

BACKGROUND OF THE INVENTION

1. Field of the Invention

The present invention relates to a suspension board with circuit and, more particularly, to a suspension board with circuit used for a hard disc driver.

2. Description of the Prior Art

A suspension board with circuit used for a hard disc driver is a circuit board in which lines of wire for connecting between a magnetic head and a read/write board to which read/write signals to be read and written by the magnetic head are transmitted are integrally formed in the suspension board suspending the magnetic head. This suspension board with circuit can suspend the magnetic head mounted thereon to keep its good floating position, with a minute interval between the magnetic head and a magnetic disk being held against an airflow generated when the magnetic head and the magnetic disk run relative to each other. Due to this, the suspension board with circuit is becoming widely used.

This suspension board with circuit usually comprises a metallic supporting plate 1 formed of a stainless foil, a base layer 2 formed of an insulating material formed on the metallic supporting plate 1, a conductive layer 3 formed on the base layer 2 in the form of a specific circuit pattern, and a cover layer 4, formed of an insulating material, for covering the conductive layer 3, as shown in FIG. 21. Also, the suspension board has external connection terminals 5 formed to connect the lines wire formed in the form of the circuit pattern with the read/write board 9.

The external connection terminals 5 have pad portions 8 comprising e.g. a nickel plated layer 6 and a gold plated layer 7 formed in sequence by plating on the conductive layer 3 exposed by opening the cover layer 4. The terminals 10 of the read/write board 9 and the pad portions 8 are superimposed with each other and are bonded to each other in the superimposed state, for example, by applying supersonic vibration from the outside of the metallic supporting plate 1 (as indicated by an arrow in FIG. 21), as indicated by a phantom line.

With this connection between the external connection terminals 5 and the terminals 10 of the read/write board 9, since the supersonic vibration which is applied from the outside of the metallic supporting plate 1 is transmitted from the metallic supporting plate 1 to the pad portions 8 through the base layer 2 and the conductive layer 3, the vibration is damped until it reaches the pad portions 8. As a result of this, the vibration damped sometimes may not be strong enough to bond the terminals to each other. Because of this, the terminals sometimes cannot be bonded to each other with sufficient strength and, thus, sufficient bonding reliability sometimes may not be obtained.

On the other hand, it may be conceivable that the supersonic vibration is applied from the outside of the read/write board 9 at a side thereof at which the terminals 10 are formed, but the read/write board 9 is usually so large in thickness that the supersonic vibration cannot be transmitted with ease. Thus, in this case also, the terminals still cannot be bonded to each other with sufficient strength.

It is the object of the present invention to provide a suspension board with circuit that enables its terminals to be bonded to the other terminals with sufficient strength with simple structure, to ensure sufficient bonding reliability.

SUMMARY OF THE INVENTION

A suspension board with circuit of the present invention comprises a metal supporting layer, an insulating layer formed on the metal supporting layer and a conductive layer formed on the insulating layer and has a terminal portion formed to connect with an external circuit, wherein the terminal portion is formed without the metal supporting layer and/or the insulating layer being formed.

According to the suspension board with circuit of the present invention, since both of the metal supporting layer and the insulating layer or either of them are not formed at the terminal portion, in the case where the terminal portion is bonded to an external circuit, for example when external force such as supersonic vibration and equivalent is applied from the outside of the metal supporting layer or the insulating later, the external force such as the supersonic vibration is transmitted to the bonded portion without passing through both of or either of the metal supporting layer and the insulating layer. Thus, the vibration is transmitted to the bonded portion with little damped external force. Hence, the both terminals can be bonded to each other with higher strength to thereby produce improved bonding reliability therebetween.

In the suspension board with circuit of the present invention, preferably, the terminal portion may be substantially formed by the insulating layer, the conductive layer formed on the insulating layer and a pad portion formed on the conductive layer, may be substantially formed by the metal supporting layer, the conductive layer formed on the metal supporting layer and the pad portion formed on the conductive layer, or may be substantially formed by the conductive layer and the pad portion formed on the conductive layer.

Figure 2:
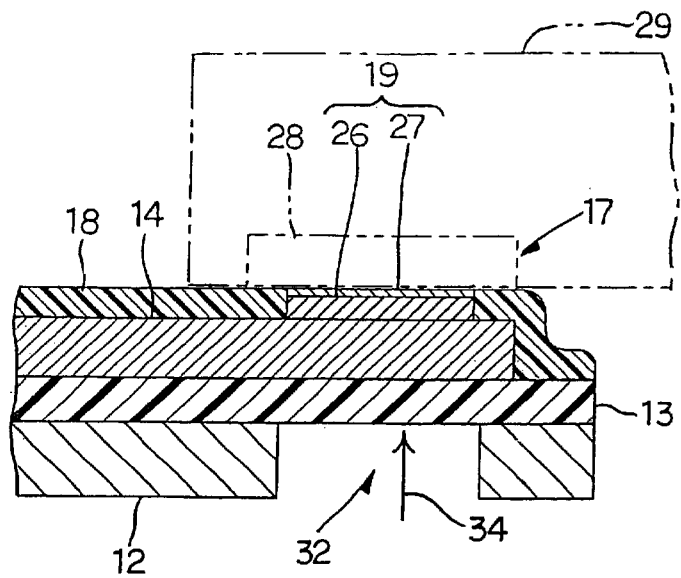
FIG. 2 is a sectional view of an external connection terminal of the suspension board with circuit shown in FIG. 1, taken along a longitudinal direction of the suspension board with circuit.
Figure 3:
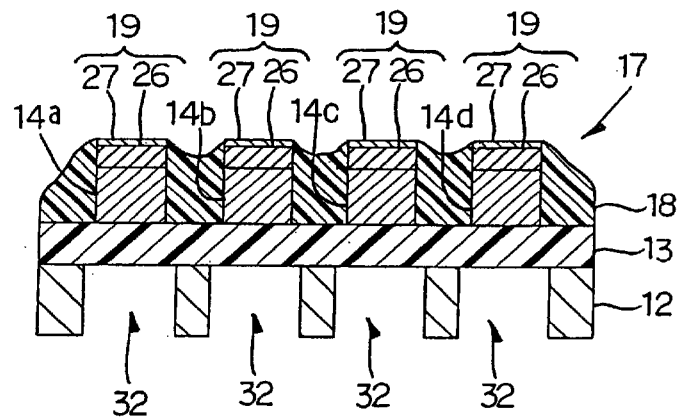
FIG. 3 is a sectional view of the external connection terminals of the suspension board with circuit shown in FIG. 1, taken along a direction orthogonal to the longitudinal direction of the suspension board with circuit.
Figure 6:
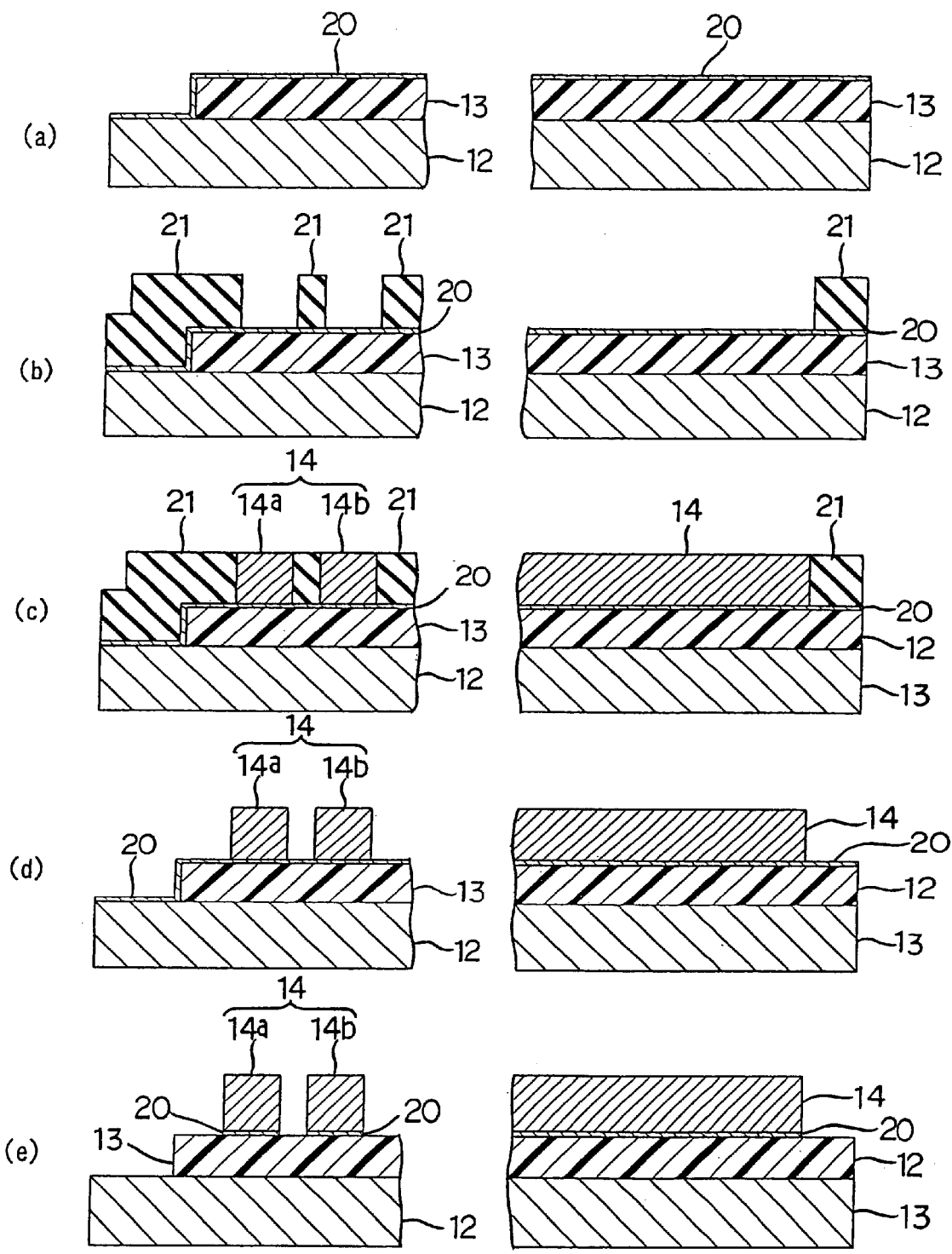
Figure 7:
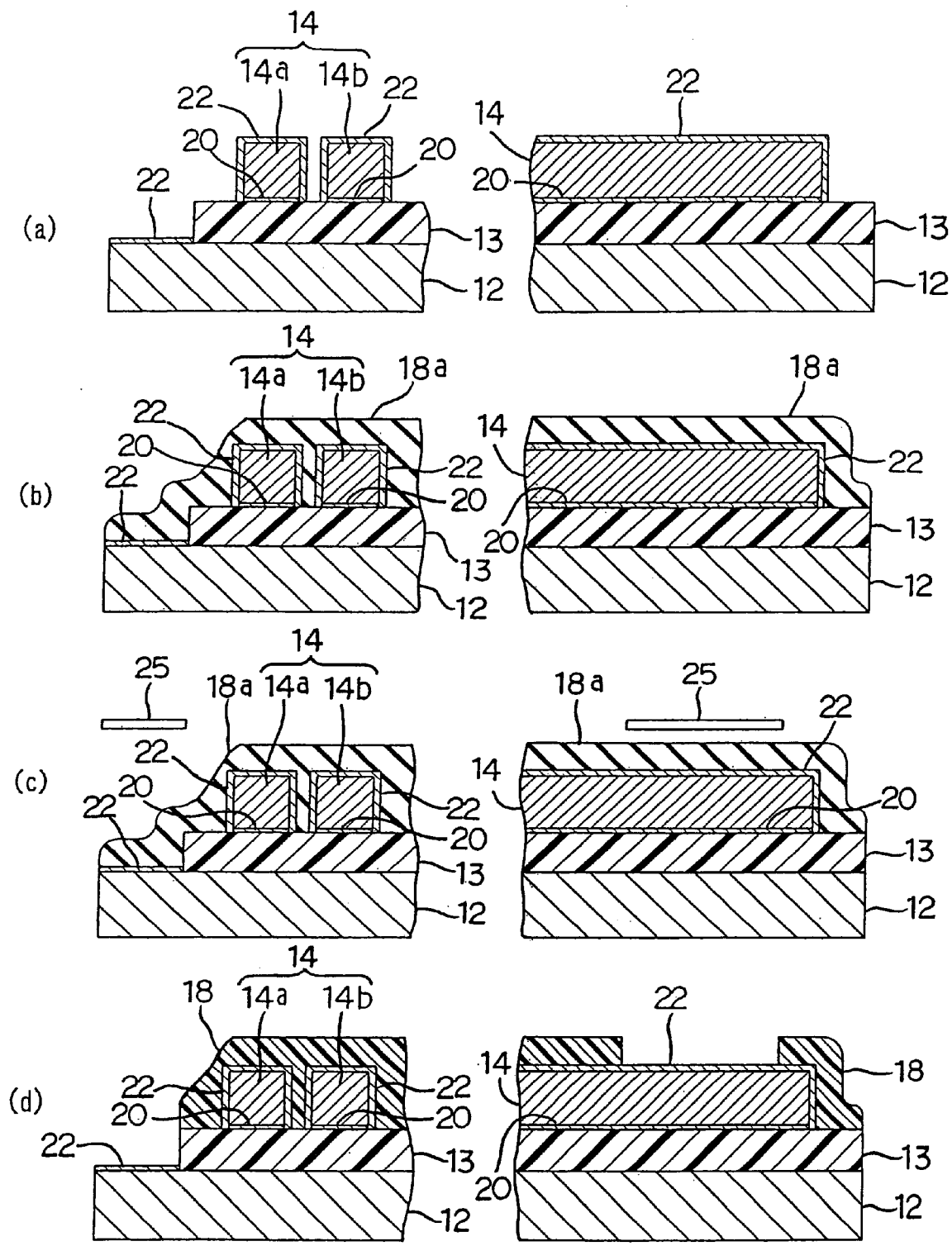
Figure 8:
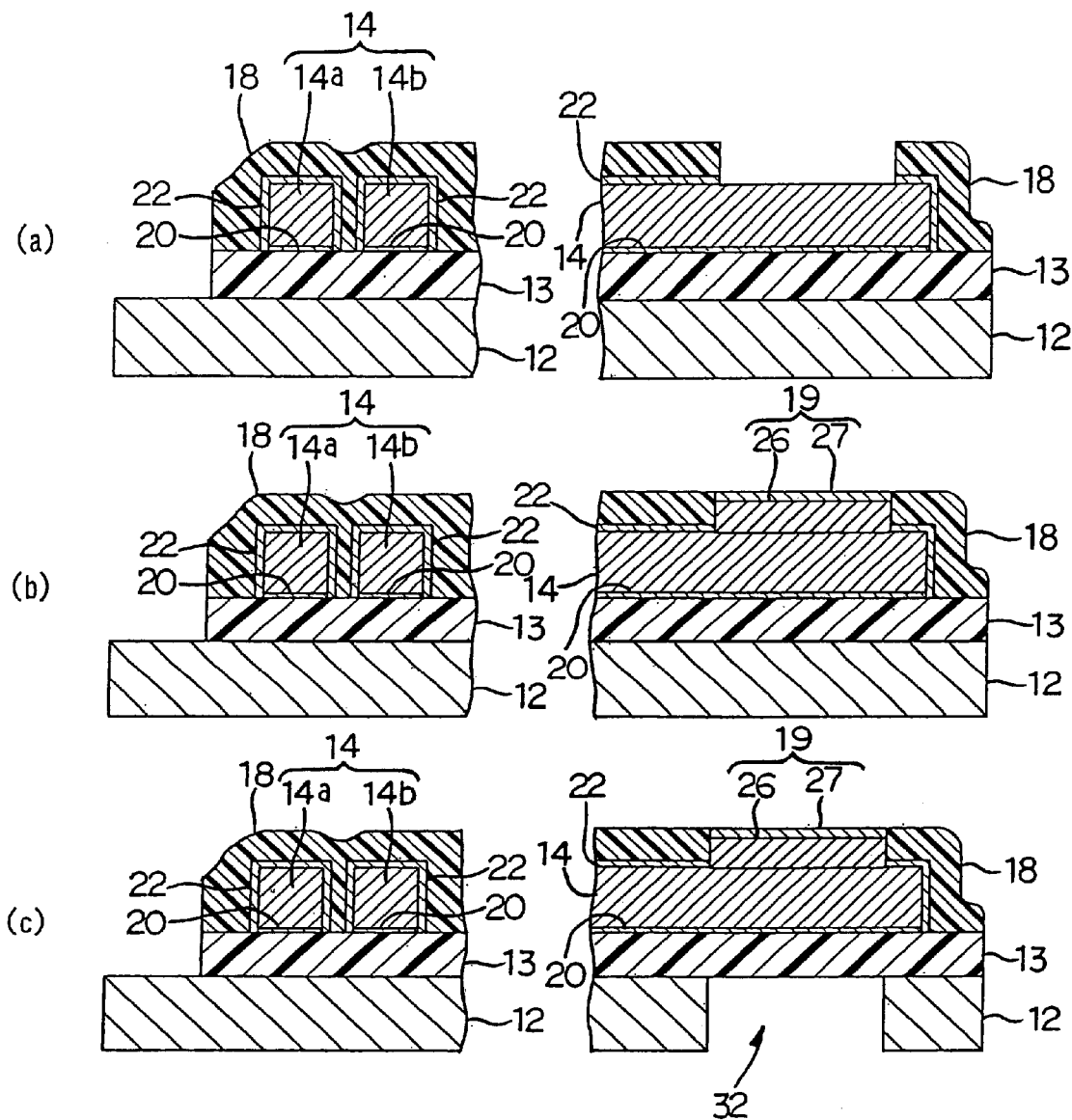
Figure 9:
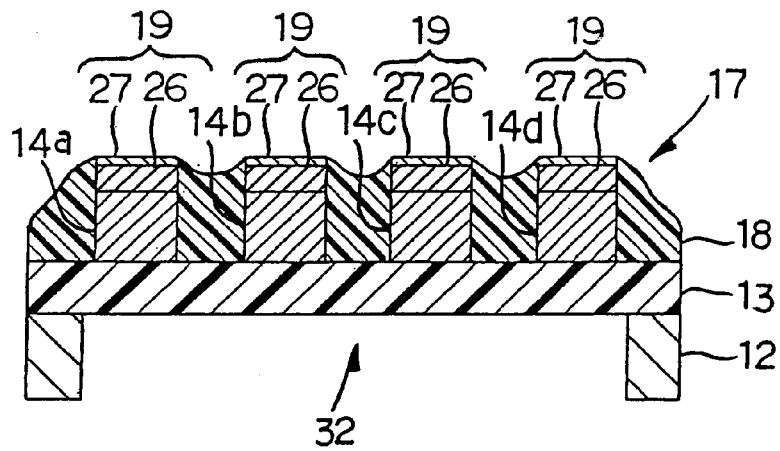
Figure 10:
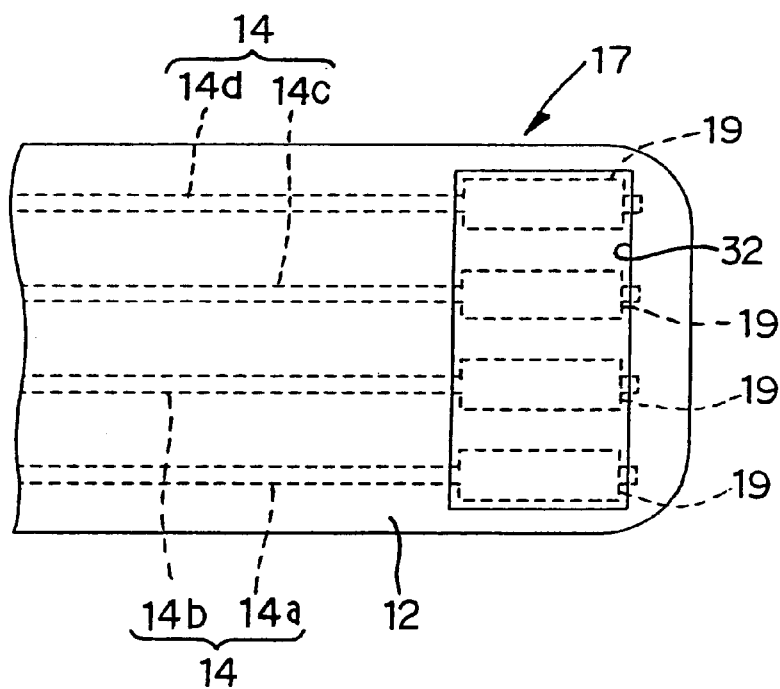
Figure 11:
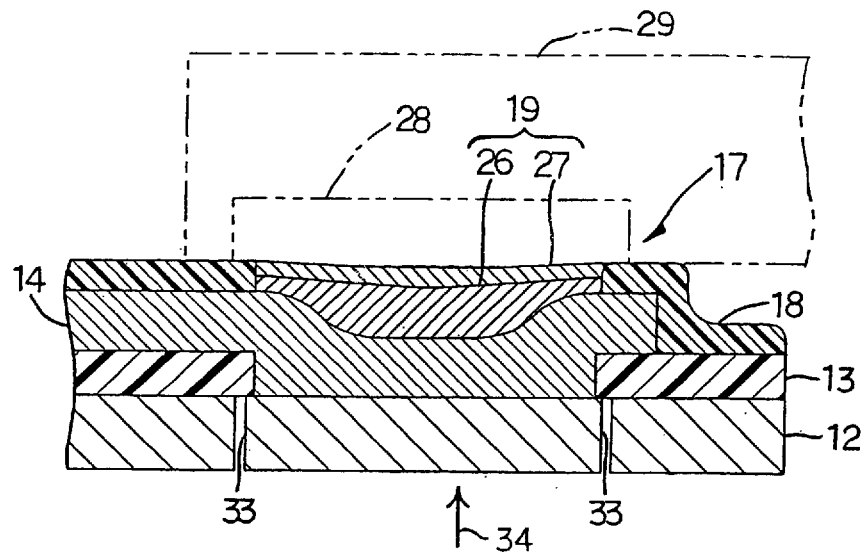
Figure 12:
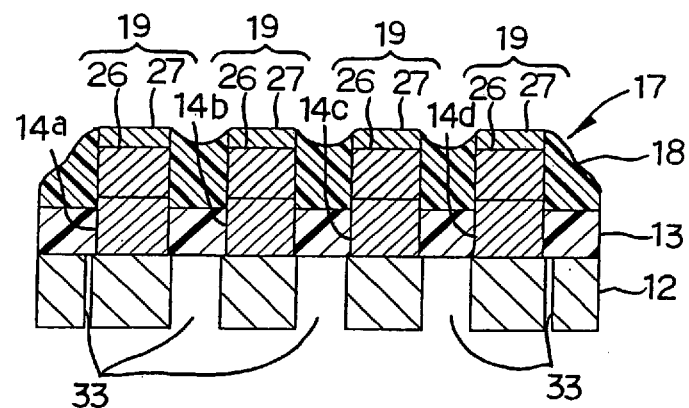
Figure 13:
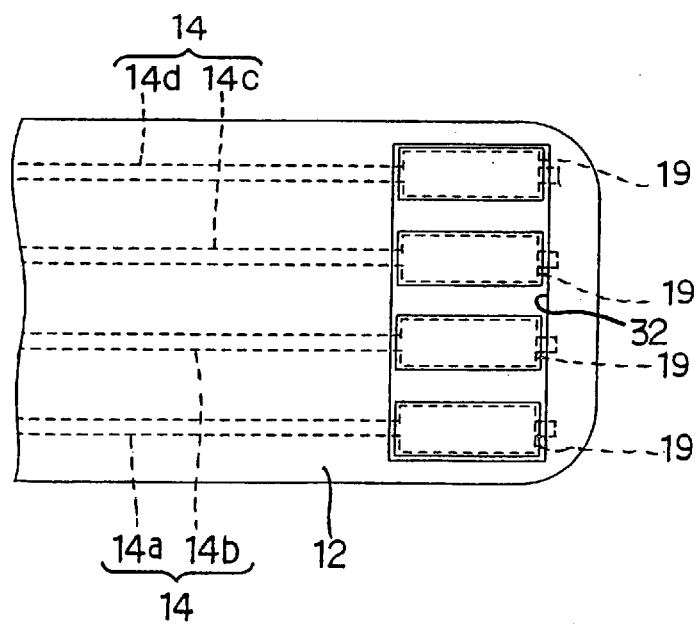
Figure 14:
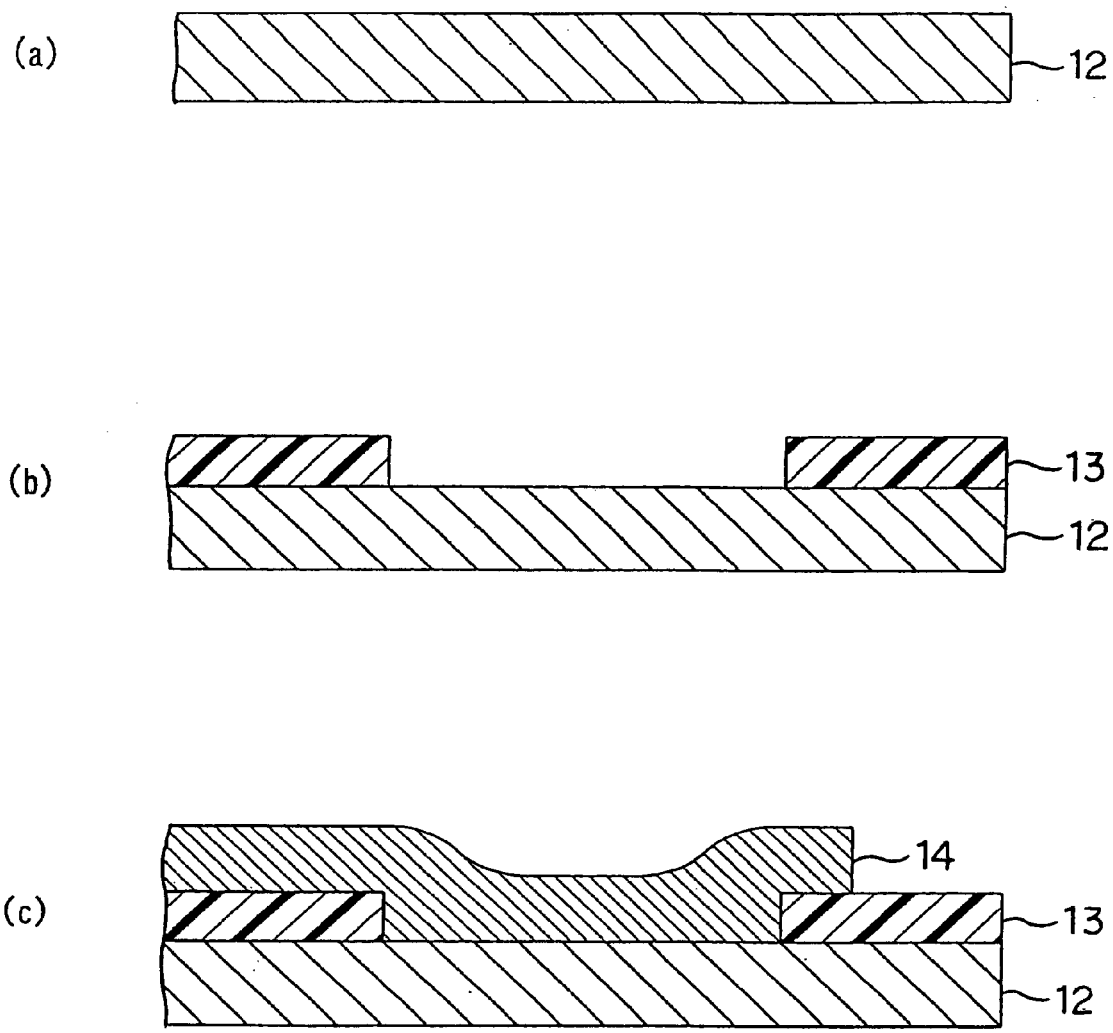
Figure 15:
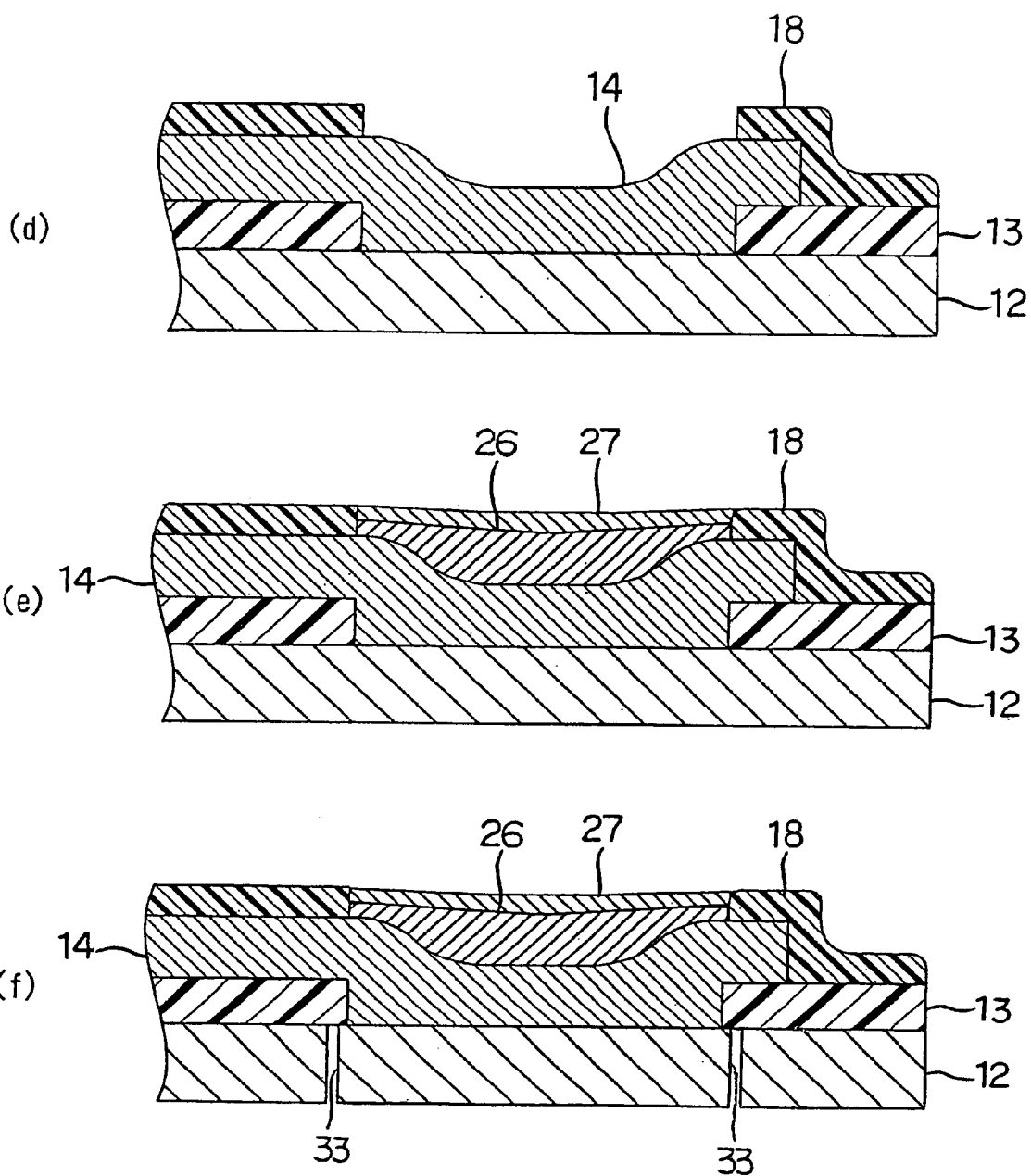
Figure 16:
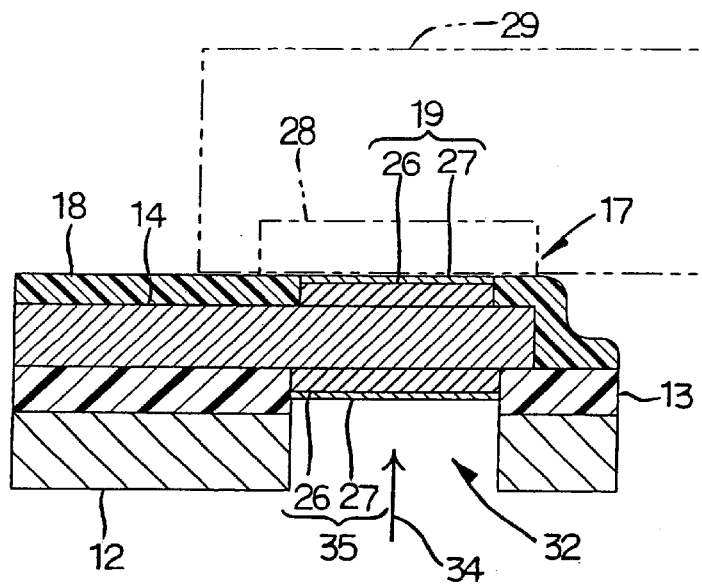
Figure 17:
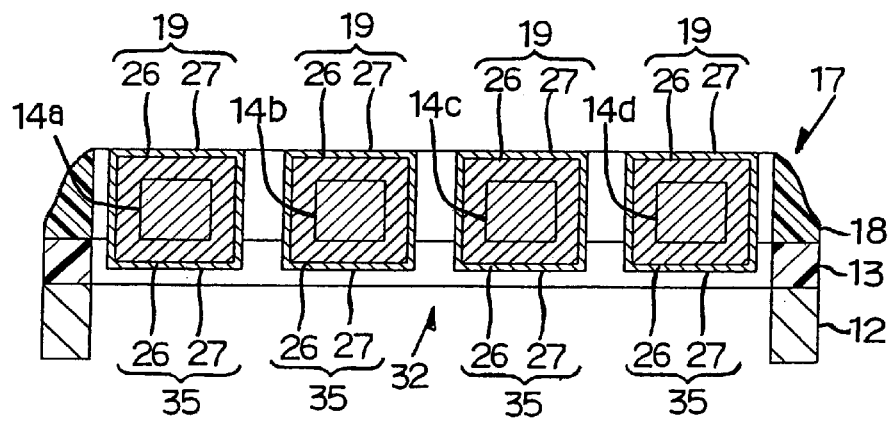
Figure 18:
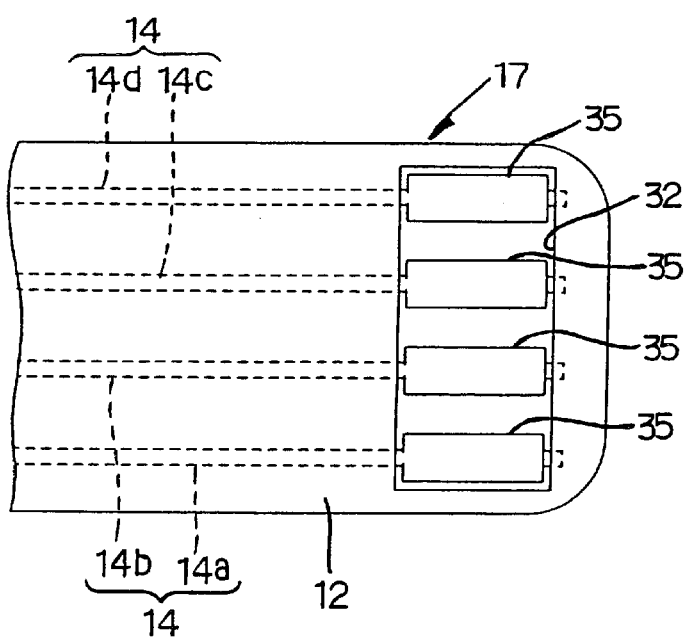
Figure 19:
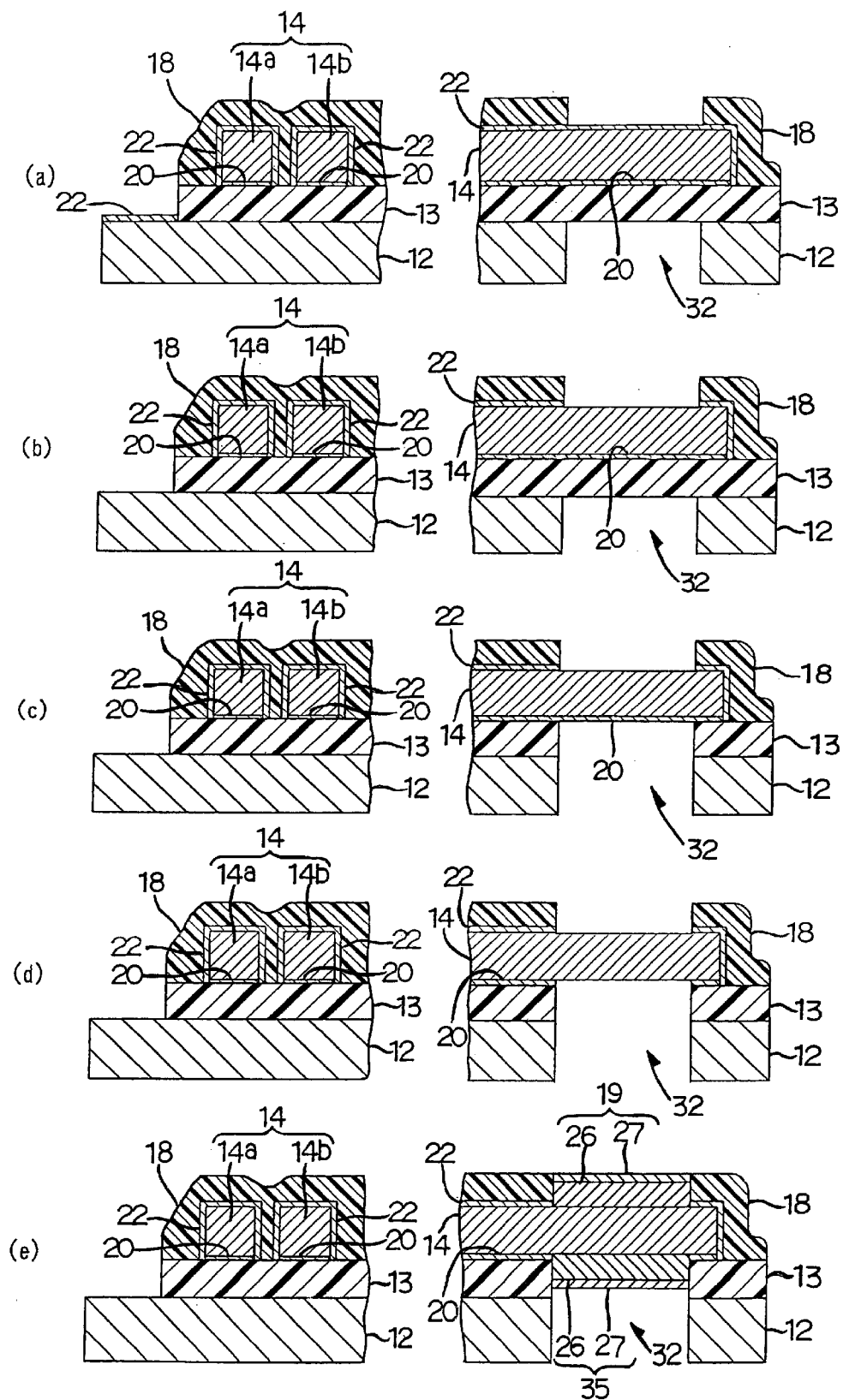
Figure 20:
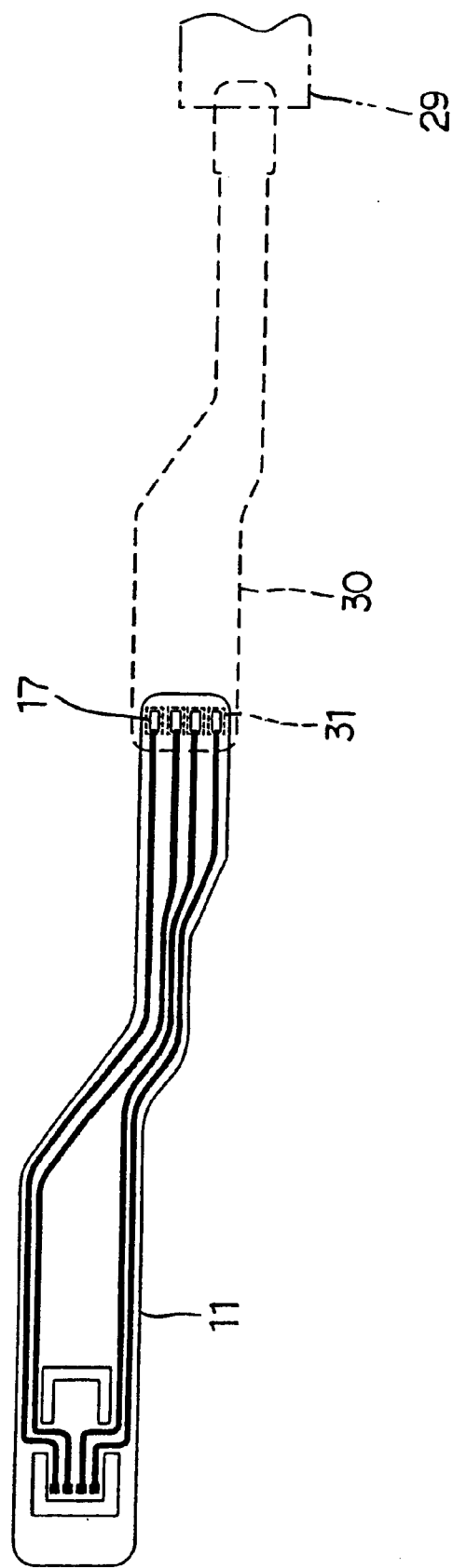
Figure 21:
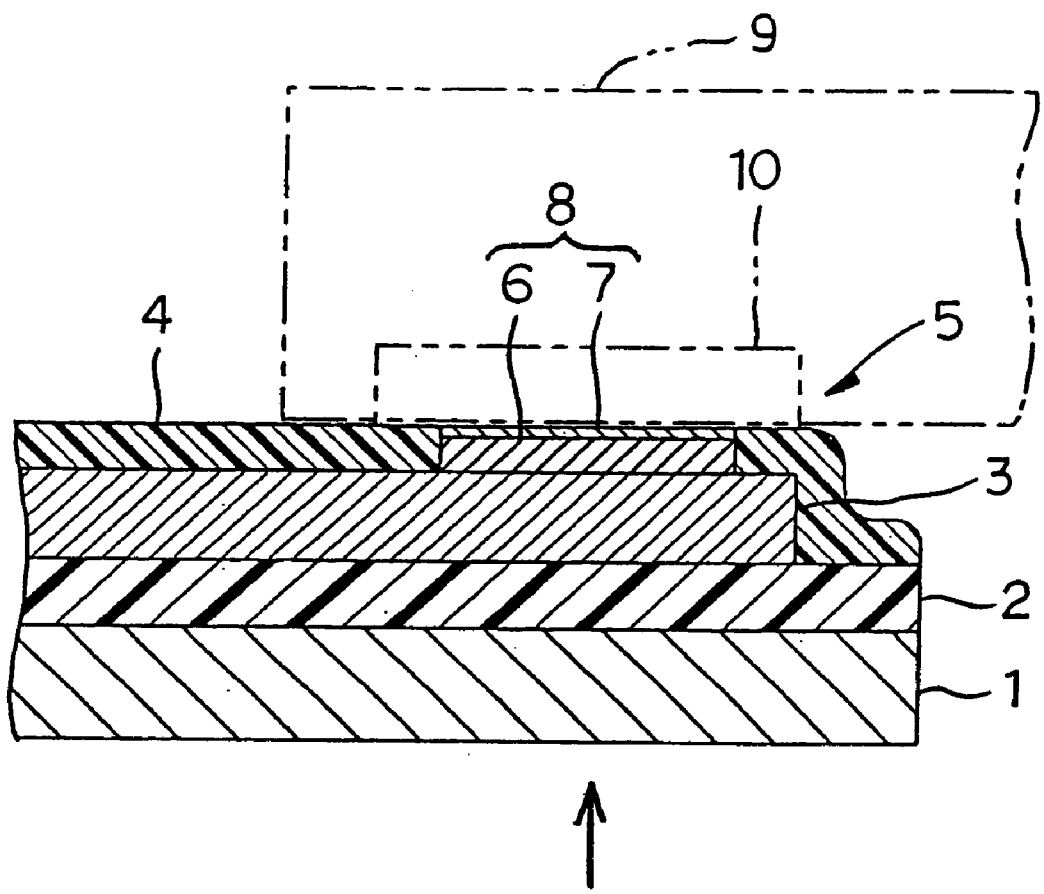
Figure 22:
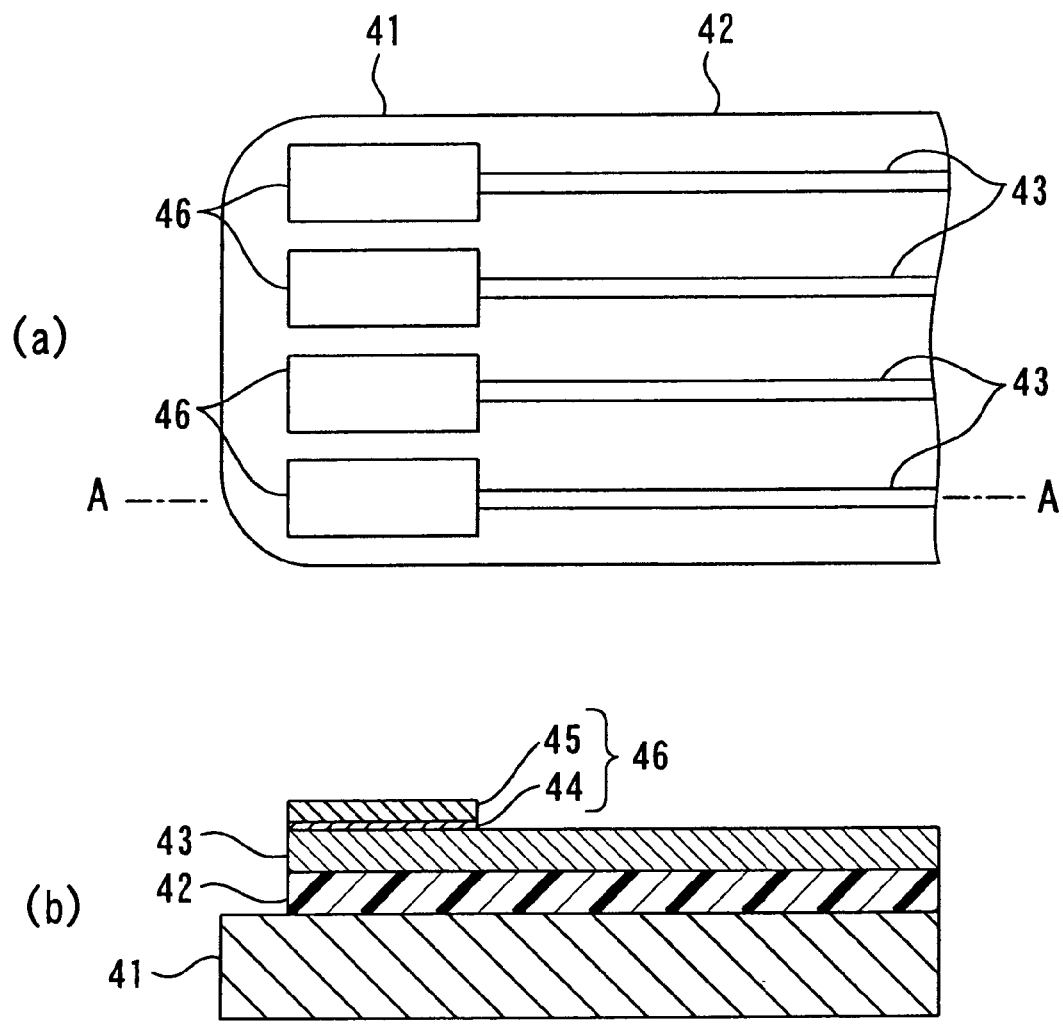
Figure 23:
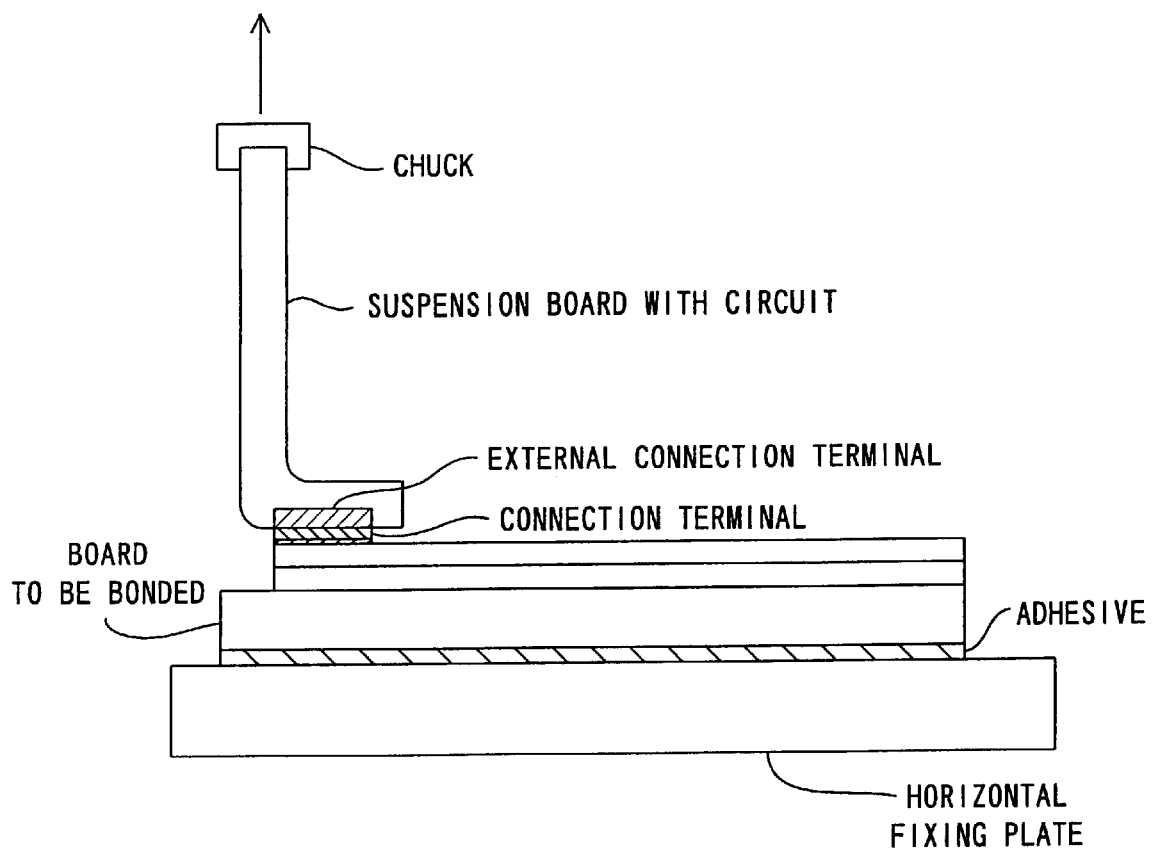

(a) the step of preparing a suspension board;

(b) the step of forming a coating of a precursor of a photosensitive polyimide resin on the suspension board;

(c) the step of exposing the coating to light through a photomask and developing it to form a specified pattern; and (d) the step of curing the patterned coating to form the base layer, FIG. 6 is a sectional view showing the steps of forming on the base layer a conductive layer with a specified circuit pattern;

(a) the step of forming a ground on the suspension board and the base layer;

(b) the step of forming on the ground a plating resist of an opposite pattern to the specified circuit pattern;

(c) the step of forming a conductive layer of a specified circuit pattern on a portion of the base layer in which no plating resist is formed, by using an electrolysis plating;

(d) the step of removing the plating resist; and (e) the step of removing the ground, FIG. 7 is a sectional view showing the steps that after a surface of the conductive layer of the circuit pattern is protected by a thin metal film, the surface of the conductive layer is covered with a cover layer;

(a) the step of forming the thin metal film on surfaces of the conductive layer;

(b) the step of forming a coating of a precursor of a photosensitive polyimide resin on the base layer and the thin metal film;

(c) the step of patterning the coating by exposing the coating to light through a photomask and developing it; and (d) the step of curing the patterned coating to form the cover layer, FIG. 8 is a sectional view showing the steps of forming the external connection terminals;

(a) the step of peeling the thin metal film formed on the exposed conductive layer and the suspension board;

(b) the step of forming pad portions by forming a nickel plated layer and a gold plated layer on the exposed conductive layer; and (c) the step of opening a part of the suspension board corresponding to the pad portions, FIG. 9 is a sectional view of the external connection terminals of a variant of the suspension board with circuit of FIG. 3, taken along a direction orthogonal to the longitudinal direction of the suspension board with circuit, FIG. 10 is a rear view of the external connection terminals of the suspension board with circuit shown in FIG. 9, FIG. 11 is a sectional view of the external connection terminals of a variant of the suspension board with circuit shown in FIG. 2, taken along the longitudinal direction of the suspension board with circuit, FIG. 12 is a sectional view of the external connection terminals of the suspension board with circuit shown in FIG. 11, taken along a direction orthogonal to the longitudinal direction of the suspension board with circuit, FIG. 13 is a rear view of the external connection terminals of the suspension board with circuit shown in FIG. 11, FIG. 14 is a sectional view showing the steps of forming the external connection terminals of the suspension board with circuit shown in FIG. 11;

(a) the step of preparing a suspension board;

(b) the step of forming the base layer on the suspension board with a specific pattern excepting a pads forming portion; and (c) the step of forming the conductive layer of the specific circuit pattern, FIG. 15 is a sectional view showing the steps of forming the external connection terminals of the suspension board with circuit shown in FIG. 11 following to FIG. 14;

(d) the step of forming a cover layer;

(e) the step of forming the pad portions; and (f) the step of cutting out the suspension board to surround the pad portions, FIG. 16 is a sectional view of external connection terminals of a variant of the suspension board with circuit shown in FIGS. 2 and 11, taken along a longitudinal direction of the suspension board with circuit, FIG. 17 is a sectional view of the external connection terminals of the suspension board with circuit shown in FIG. 16, taken along a direction orthogonal to the longitudinal direction of the suspension board with circuit, FIG. 18 is a rear view of the external connection terminals of the suspension board with circuit shown in FIG. 16, FIG. 19 is a sectional view showing the steps of forming the pad portions of the external connection terminals of the suspension board with circuit shown in FIG. 16;

(a) the step of opening a part of the suspension board corresponding to the pad portions;

(b) the step of peeling a thin metal film formed on the exposed conductive layer and suspension board;

(c) the step of opening the exposed base layer at the opening of the suspension board to match with the opening;

(d) the step of peeling the ground exposed by opening the base layer; and (e) the step of forming the pad portions on a front surface of the exposed conductive layer by plating and concurrently forming the same plated layer on a back surface of the exposed conductive layer, FIG. 20 is a plan view showing the suspension board with circuit of a short tail type, FIG. 21 is a sectional view of the external connection terminals of a conventional type of suspension board with circuit, FIG. 22(a) is a top view of a bonded board used for evaluation and (b) is a sectional view taken along line A—A, and FIG. 23 is an illustration for explaining a 90° peel test.

DETAILED DESCRIPTION OF THE PREFERRED EMBODIMENTS

Figure 1:
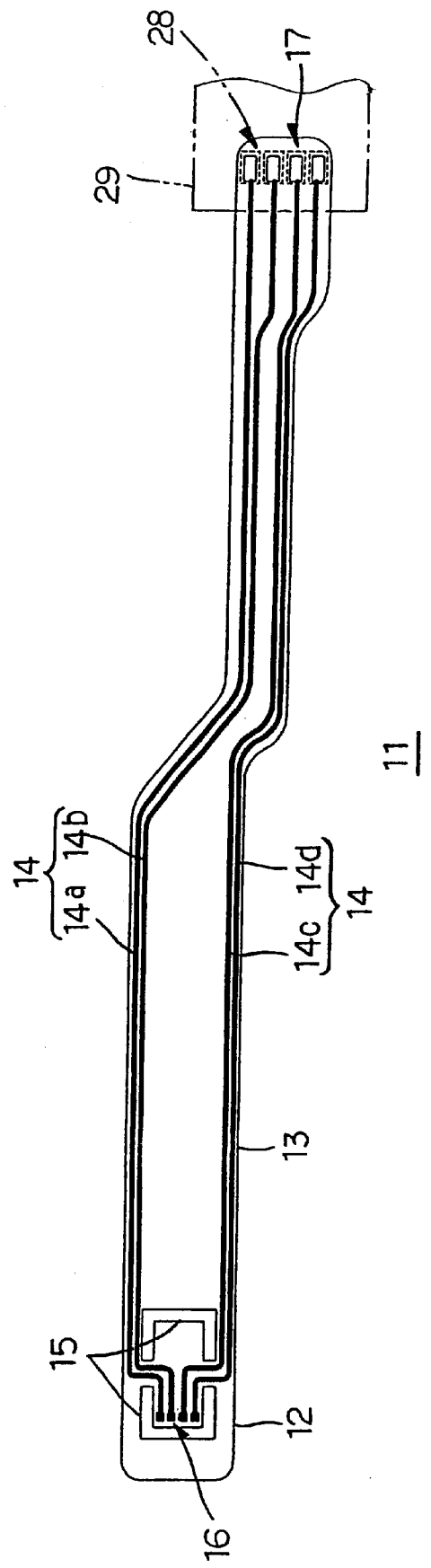
FIG. 1 is a plan view showing an embodiment of a suspension board with circuit of the present invention.

Referring to FIG. 1, there is a plan view showing an embodiment of a suspension board with circuit of the present invention. The suspension board with circuit mounts thereon a magnetic head of a hard disk driver (not shown) and suspends the magnetic head while holding a minute interval between the magnetic head and a magnetic disk against an airflow generated when the magnetic head and the magnetic disk run relative to each other. The suspension board with circuit has the lines of wire, integrally formed therewith in the form of a specific circuit pattern, for connecting the magnetic head and the read/write board formed as an external circuit.

In FIG. 1, in the suspension board with circuit 11, a base layer 13 formed as an insulating layer of insulating material is formed on a suspension board 12 extending longitudinally as a metal supporting layer. A conductive layer 14 formed in the form of a specific circuit pattern is formed on the base layer 13. The circuit pattern is formed in the form of a plurality of lines of wire 14a, 14b, 14c, 14d arrayed in parallel spaced apart at a predetermined interval. Gimbals 15 for fitting the magnetic heads therein are formed in the suspension board 12 by cutting out the suspension board 12 at a front end portion thereof. At the front end portion of the suspension board 12, magnetic head connection terminals 16 are formed to connect between the magnetic head and the lines of wire 14a, 14b, 14c, 14d. At the rear end portion of the suspension board 12, external connection terminals 17 are formed as a terminal portion for connecting therethrough terminals 28 of the read/write board 29 and the lines of wire 14a, 14b, 14c, 14d.

The conductive layer 14 is actually covered with a cover layer 18 made of insulating material, though not shown in FIG. 1.

Figure 4:
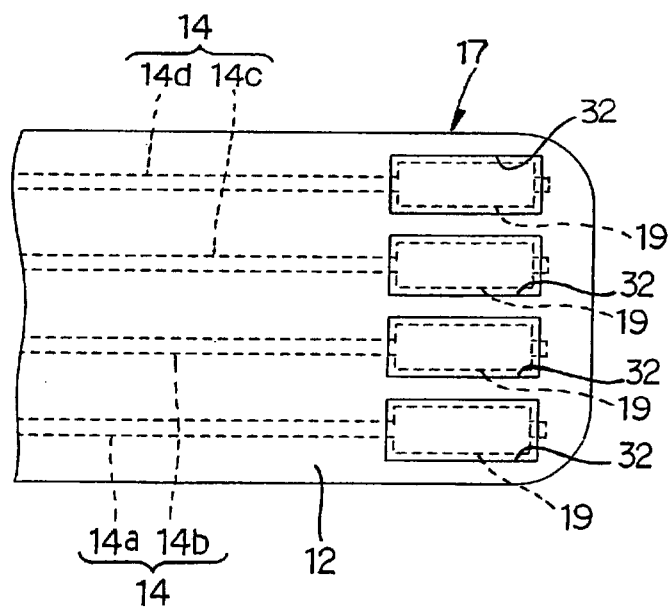
FIG. 4 is a rear view of the external connection terminals of the suspension board with circuit shown in FIG. 1.

In this suspension board with circuit 11, for example, the external connection terminals 17 are substantially formed by the base layer 13, the conductive layer 14 formed on the base layer 13 and the pad portion 19 formed on the conductive layer 14 exposed by opening the cover layer 18, as shown in FIGS. 2–4 and the suspension board 12 has openings formed at portions thereof at which the external connection terminals 17 are formed. In FIGS. 2 and 3, in the external connection terminals 17, the cover layer 18 is opened to have generally rectangle-shaped openings corresponding to the lines of wire 14a, 14b, 14c and 14d at the ends of the lines of wire 14a, 14b, 14c and 14d, and a nickel plated layer 26 and a gold plated layer 27 are formed as the pad portion 19 on the conductive layer 14 exposed in each of the openings. Also, as shown in FIG. 4, generally rectangle-shaped openings 32 corresponding to the pad portions 19 are separately formed on the suspension board plate 12 in the generally same size as that of the pad portions. It is to be noted that in FIGS. 2–4, a ground 20 and a thin metal film 22 as mentioned later are omitted.

Next, a process for manufacturing the suspension board with circuit 11 will be described in detail with reference to FIGS. 5 to 8. In FIGS. 5–8 at the right sides thereof, a part of the suspension board with circuit 11 in which the external connection terminals 17 are formed is shown in section taken along the longitudinal direction of the suspension board with circuit 11. In FIGS. 5–8 at the left sides thereof, a lengthwise part of the suspension board with circuit 11 is shown in section taken along a direction orthogonal to the longitudinal direction of the suspension board with circuit 11.

Figure 5:
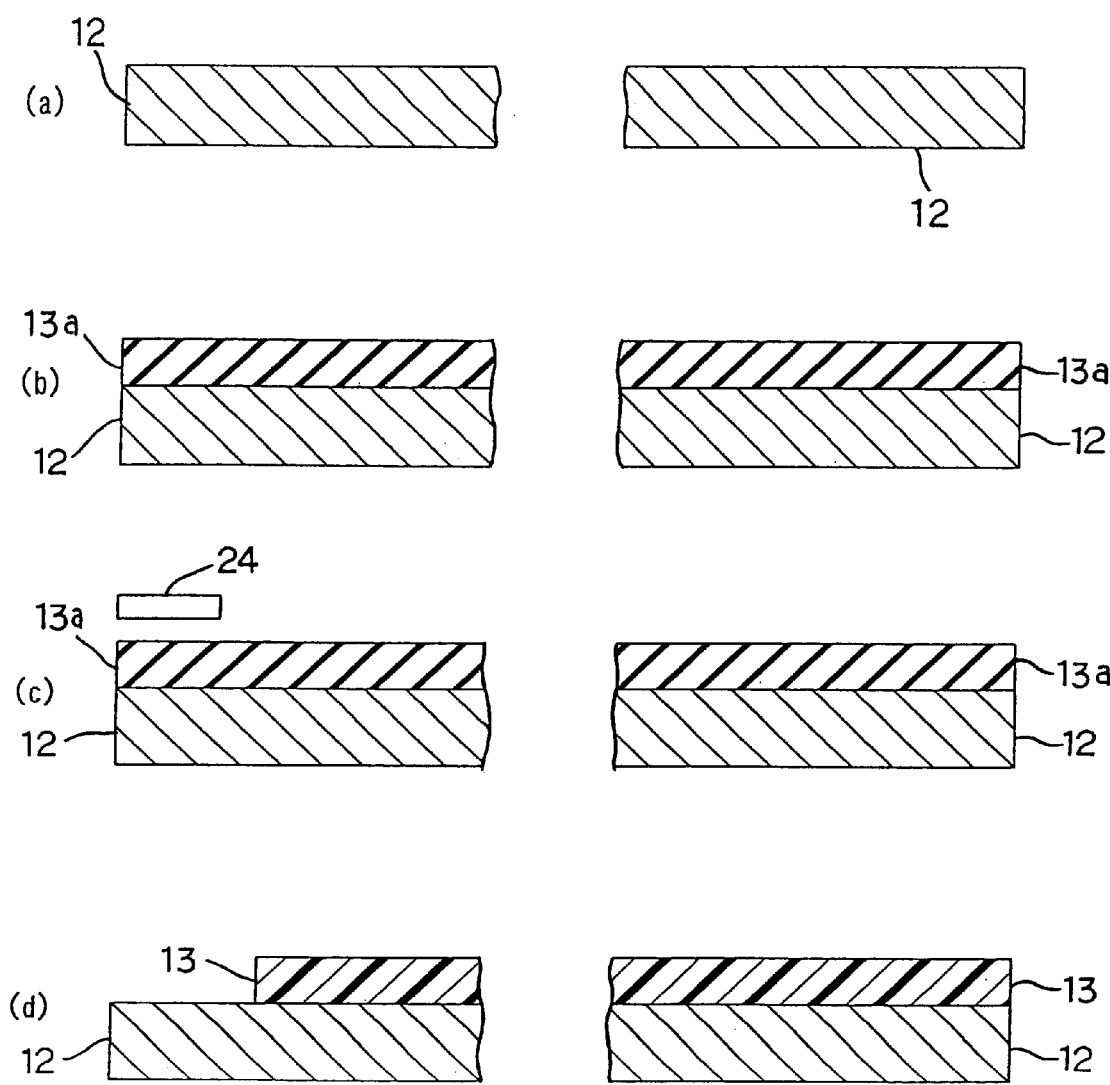
FIG. 5 is a sectional view showing the steps of preparing a suspension board and forming on the suspension board a base layer with a specified pattern.

First, the suspension board 12 is prepared and the base layer 13 is formed on the suspension board 12 in the form of the specified pattern, as shown in FIG. 5. A metal foil or a metal sheet is preferably used as the suspension board 12. For example, stainless steel, 42 alloy and the like are preferably used. The suspension board used preferably has a thickness of 10–60 $\mu$m, or further preferably 15–30 $\mu$m, and a width of 50–500 mm, or further preferably 125–300 mm.

Any insulating material which may be used as the suspension board with circuit may be used as the insulating material used for forming the base layer 13 without any particular limitation. Those insulating materials include, for example, synthetic resins such as polyimide resin, acrylic resin, polyether nitrile resin, polyether sulfonic resin, polyethylene terephthalate resin, polyethylene naphthalate resin and polyvinyl chloride resin. Of these synthetic resins, a photosensitive synthetic resin is preferably used as the base layer. A photosensitive polyimide resin is further preferably used.

Then, for example, in the case where the base layer 13 is formed on the suspension board 12 in the form of the specified pattern by using photosensitive polyimide resin, liquid solution of precursor of the photosensitive polyimide resin (polyamic acid resin (which means photosensitive polyamic acid resin unless otherwise specified)) as shown in FIG. 5(b) is applied to the entire surface of the suspension board 12 prepared as shown in FIG. 5(a), first, and then is heated at 60–150° C., or preferably at 80–120° C., to form a coating 13a of the precursor of the photosensitive polyimide resin.

Then, the coating 13a is exposed to light through a photomask 24, as shown in FIG. 5(c). If required, the exposed part is heated to a certain temperature. Thereafter, the coating is developed to form the coating 13a into a specified pattern. Preferably, radiation irradiated through the photomask 24 has an exposure wavelength of 300–450 nm, or preferably 350–420 nm. An integrated quantity of exposure light is preferably of 100–1,000 mJ/cm$^2$, or further preferably 200–700 mJ/cm$^2$. Further, when the exposed part of the coating 13a irradiated is heated, for example, at not less than 130° C. to less than 150° C., it is solubilized (positive type) in the next processing procedure, while on the other hand, when heated, for example, at not less than 150° C. to not more than 180° C., it is insolubilized (negative type) in the next processing procedure. The development can be performed by any known method, such as a dipping process and a spraying process, by using a known developing solution such as alkaline developer. Preferably, the manufacturing method uses the negative type to produce the circuit pattern. Illustrated in FIG. 5 is an embodiment using the negative type of process steps for patterning the circuit.

As shown in FIG. 5(d), the coating 13a of the precursor of the polyimide resin thus patterned is finally heated, for example, to 250° C. or more to be cured (imidized), whereby the base layer 13 made of polyimide is formed in the form of the specified pattern.

In the case where the photosensitive resin is not used, for example resin may be applied on to the suspension board 12 in the specified pattern or may be bonded thereto in the form of a dry film.

Preferably, the base layer 13 thus formed has thickness of e.g. 2–30 $\mu$m, or preferably 5–20 $\mu$m.

Sequentially, the conductive layer 14 is formed on the base layer 13 in the form of a specified circuit pattern. The conductive layer 14 formed in the form of the specified pattern is made of conductive material. Any conductive material may be used without any particular limitation, as long as it can be used as a conductive material of the suspension board with circuit. The conductive materials that may be used include, for example, copper, nickel, gold, solder or alloys thereof. Copper is preferably used. To form the conductive layer 14 with the specified circuit pattern, the conductive layer 14 may be formed in the specified pattern in any known patterning process, such as a subtracting process, an additive process and a semi-additive process.

In the subtracting process, the conductive layer 14 is first laminated on the entire surface of the base layer 13, through an adhesive layer, as required, and then an etching resist is formed on the conductive layer 14 so as to match with the specified circuit pattern. With the etching resist as a resist, the conductive layer 14 is etched and thereafter the etching resist is removed from the conductive layer 14.

In the additive process, a plating resist with an opposite pattern to the specified circuit pattern is formed on the base layer 13, first. Then, the conductive layer 14 is formed in the form of the specified circuit pattern by plating on a surface of the base layer 13 on which the plating resist is not formed. Thereafter, the plating resist is removed.

In the semi-additive process, a thin film of conductive material that is formed as a ground is formed on a base layer 13, first, and then a plating resist is formed on the ground with an opposite pattern to the specified circuit pattern. Then, a conductive layer 14 is formed in the form of a specified circuit pattern by plating on a surface of the ground on which the plating resist is not formed. Thereafter, the plating resist and the ground on which the plating resist is laminated are removed. Of these patterning processes, the semi-additive process is preferably used, as shown in FIG. 6. Specifically, first, a thin film of the conductive material that is to form a ground 20 is formed on the entire surface of the suspension board 12 and the base layer 13, as shown in FIG. 6(*a*). Preferably, the ground 20 is formed by use of a vacuum deposition process, or preferably by sputtering deposition process. Preferably, chromium and copper are used as the conductive material that forms the ground 20. To be more specific, a thin chrome film and a thin copper film are preferably formed in sequence on the entire surface of the suspension board 12 and the entire surface of the base layer 13 by the sputtering deposition process. Preferably, the thin chrome film has a thickness of 100–600 Å and the thin copper film has a thickness of 500–2,000 Å.

Sequentially, a plating resist 21 having the opposite pattern to the specified circuit pattern is formed on the ground 20, as shown in FIG. 6(*b*). The plating resist 21 can be formed in the form of a specified resist pattern, for example, by using a dry film resist by a known process. Then, the conductive layer 14 having the specified circuit pattern is formed on a portion of the base layer 13 where no plating resist 21 is formed, by plating, as shown in FIG. 6(*c*). Though either of electrolysis plating and electroless plating may be used, the electrolysis plating is preferably used. Among others, the electrolysis copper plating is preferably used. The circuit pattern is formed in the form of a pattern formed, for example, by a plurality of lines of wire 14*a*, 14*b*, 14*c*, 14*d* which are spaced apart in parallel with a given interval, as shown in FIG. 1. The conductive layer 14 has a thickness of e.g. 2–20 μm, or preferably 5–18 μm. The lines of wire 14*a*, 14*b*, 14*c*, 14*d* have each a width of e.g. 10–500 μm, or preferably 30–200 μm. The interval between the lines of wire 14*a*, 14*b*, 14*c*, 14*d* is e.g. 10–200 μm, or preferably 30–100 μm.

Then, the plating resist 21 is removed by a known etching process, such as a chemical etching process (wet etching), or by peeling, as shown in FIG. 6(*d*). Thereafter, the part of the ground 20 on which the plating resist 21 was formed is likewise removed by a known etching process, such as a chemical etching process (wet etching), as shown in FIG. 6(*e*). Through these process steps the conductive layer 14 is formed on the base layer 13 in the form of the specified circuit pattern.

Sequentially, after the surface of the conductive layer 14 is protected by a thin metal film 22, the conductive layer 14 is covered with the cover layer 18 formed of insultating material as shown in FIG. 7. Specifically, the thin metal film 22 is, first, formed on the surface of the conductive layer 14 and the front surface of the suspension board 12, as shown in FIG. 7(*a*). Preferably, the thin metal film 22 is formed in the form of a hard, thin nickel film by electroless nickel plating. The thin metal film 22 is only required to have a thickness enough to prevent the surface of the conductive layer 14 from being exposed. For example, the thin metal film 22 can have a thickness of about 0.05 to about 0.1 μm.

Sequentially, the cover layer 18 for covering the conductive layer 14 is formed in the form of a specified pattern. The same insulating material is used as the insulating material for forming the cover layer 18. Preferably, photosensitive polyimide resin is used.

In the case where the cover layer 18 is formed by using the photosensitive polyimide resin, liquid solution of precursor of the photosensitive polyimide resin (polyamic acid resin) is applied to the entire surface of the base layer 13 and the thin metal film 22, as shown in FIG. 7(*b*), and then is heated at e.g. 60–150° C., or preferably at 80–120° C., to form a coating 18*a* of the precursor of the photosensitive polyimide resin. Then, the coating 18*a* is exposed to light through the photomask 25, as shown in FIG. 7(*c*). If required, the exposed part is heated to a certain temperature. Thereafter, the coating 18*a* is developed to be patterned so that the conductive layer 14 can be covered with the coating 18*a*. When the coating 18*a* is patterned, a part of the conductive layer 14 in which the pad portions 19 are to be formed is exposed, as shown in FIG. 7(*c*). The coating 18*a* can be exposed and developed under the same condition as the condition for exposing and developing the base layer 13. The patterning of the coating is preferably produced with the negative image. Shown in FIG. 7 is an embodied form in which the coating is patterned with the negative image.

As shown in FIG. 7(*d*), the coating 18*a* of the precursor of the polyimide resin thus patterned is finally heated, for example, to 250° C. or more to be cured (imidized), whereby the cover layer 18 made of polyimide is formed on the conductive layer 14. The cover layer 18 has a thickness of e.g. 1–30 μm, or preferably 2–5 μm.

Sequentially, the pad portions 19 are formed, as shown in FIG. 8. Before forming the pad portions 19, the thin metal film 22 exposed by opening the cover layer 18 in the place where the pad portions 19 are to be formed is peeled, first, as shown in FIG. 8(*a*). The thin metal film 22 formed on the suspension board 12 is also peeled off concurrently. Then, the pad portions 19 are formed on the exposed surface of the conductive layer 14 by plating. Any metal may be used for the plating without any particular limitation, as long as it can form the terminals of the suspension board with circuit. For example, copper, nickel, chromium and gold are preferably used. As to the plating, while either of electrolysis plating and electroless plating may be used, the electrolysis plating is preferably used. Among others, the electrolysis plating is preferably used. For forming the pad portions 19 by the electrolysis plating, for example the suspension board 12 and the cover layer 18 are all covered with a resist, except the part where the pad portions 19 are to be formed and then are subjected to the plating. Thereafter, the resist is removed. The pad portions 19 may be formed in multilayer. Preferably, the gold plated layer 27 is formed on the nickel plated layer 26, for example, by performing the electrolysis nickel plating and electrolysis gold plating in sequence, as shown in FIG. 8(b). Preferably, the nickel plated layer 26 and the gold plated layer 27 have each a thickness of about 1 to about 5 μm.

Then, after lead wires used in the electrolysis nickel plating and the electrolysis gold plating are removed by the chemical etching, the suspension board 12 is cut out into a predetermined shape like a gimbal 15 by a known process such as the chemical etching. At the same time as this cutting, the suspension board 12 is also cut out in generally rectangle shape to thereby form openings 32 in its portions corresponding to the pad portions 19. Thereafter, it is washed and dried to obtain the suspension board with circuit 11, as shown in FIG. 1.

Though not described, the magnetic head connection terminals 16 are also formed in the same processes as the external connection terminals 17, except that no openings are formed in the suspension board 12 in its portions corresponding to the pad portions.

The suspension board with circuit 11 thus produced is left bare of the suspension board 12 in its portion in which the external connection terminals 17 are formed. For example in the case where the external connection terminals 17 are bonded to the terminals 28 of the read/write board 29, as shown in FIG. 2, for example when supersonic vibration (which is indicated by an arrow 34 in FIG. 2) or equivalent is applied from the outside of the base layer 13, the supersonic vibration is transmitted from the base layer 13 to the pad portions 19 through the conductive layer 14, without passing through the suspension board 12. Thus, the vibration is transmitted to the pad portions 19 with little damped vibration. Hence, the external connection terminals 17 and the terminals 28 of the read/write board 29 can be bonded to each other with high strength to thereby produce improved bonding reliability therebetween.

While in the above-mentioned process the openings 32 of the suspension board 12 are formed by opening the suspension board 12 in generally rectangle shape in correspondence with the respective pad portions 19, as shown in FIGS. 3 and 4, the openings 32 may be altered, for example, by forming a single, large, rectangular opening to contain all the pad portions 19, as shown in FIGS. 9 and 10, rather than being formed separately in correspondence with every pad portion. In FIG. 10, the opening 32 of the suspension board 12 is formed in a single rectangle shape to have a size enough large to contain all parts corresponding to the respective pad portions 19. It is noted that in FIGS. 9 and 10, the ground 20 and the thin metal film 22 are omitted.

In consideration of the strength of the external connection terminals 17, it is preferable to form a plurality of openings 32 in correspondence with their respective pad portions 19, as shown in FIG. 4, rather than to form a large rectangle opening 32 as shown in FIG. 10.

The suspension board with circuit 11 of the present invention may be so modified, as shown in FIGS. 11–13, that the external connection terminals 17 may be substantially formed by the suspension board 12, the conductive layer 14 formed on the suspension board 12 and the pad portions 19 formed on the conductive layer 14 exposed by opening the cover layer 18. In FIGS. 11 and 12, in this modification of the external connection terminals 17, the base layer 13 is not formed at its parts corresponding to the pad portions 19 but the conductive layer 14 is formed directly on the suspension board 12. Also, cut-out portions 33 are formed by cutting out the suspension board 12 around its portions corresponding to their respective pad portions 19, as shown in FIG. 13. It is noted that in FIGS. 11–13, the ground 20 and the thin metal film 22 are omitted.

For example, these external connection terminals 17 can be formed as follows in the above-mentioned manufacturing process of the suspension board with circuit. First, in the processes in which the suspension board 12 is prepared, as shown in FIG. 14(a), and the base layer 13 is formed on the suspension board 12 (which processes correspond to those shown in FIGS. 5(a)–5(d)), the base layer 13 is formed to define a pattern that the base layer 13 is not formed in its portions in which the pad portions 19 are to be formed, in other words, the pattern that generally rectangle-shaped openings are formed in correspondence with their respective pad portions 19, as shown in FIG. 14(b). Then, in the processes in which the conductive layer 14 is formed with a specified circuit pattern (which processes correspond to those shown in FIGS. 6(a)–6(d)), the conductive layer 14 is formed directly on the suspension board 12 in its portions in which the pad portions 19 are formed, as shown in FIG. 14(c).

Then, in the processes in which the cover layer 18 is formed (which processes correspond to those shown in FIGS. 7(a)–7(d)), the cover layer 18 is formed to define a pattern that the cover layer 18 is not formed in its portions where the pad portions 19 are to be formed, as shown in FIG. 15(d). Then, in the processes in which the pad portions 19 are formed (which processes correspond to those shown in FIGS. 8(a)–8(d)), the conductive layer 14 exposed from the cover layer 18 is subjected to the electrolysis nickel plating and the electrolysis gold plating in sequence to form the gold plated layer 27 on the nickel plated layer 26 to thereby produce the respective pad portion 19. Subsequently, in the process in which the suspension board 12 is cut out into a specified form (which process corresponds to that shown in FIG. 8(c)), cut-out portions 33 can be formed by concurrently cutting out the suspension board 12 around its portions corresponding to their respective pad portions 19, as shown in FIG. 15(f). It is noted that in FIGS. 14 and 15, the ground 20 and the thin metal film 22 are omitted. The matters to which no reference is given in the above-mentioned description depends on the examples mentioned above.

In the suspension board with circuit 11 thus produced, its portions where the external connection terminals 17 are formed are left bare of the base layer 13. For example in the case where the external connection terminals 17 are bonded to the terminals 28 of the read/write board 29, as shown in FIG. 11, for example when supersonic vibration (which is indicated by an arrow 34 in FIG. 11) or equivalent is applied from the outside of the suspension board 12, the supersonic vibration is transmitted from the suspension board 12 to the pad portions 19 through the conductive layer 14, without passing through the base layer 13. Thus, the vibration is transmitted to the pad portions 19 with little damped vibration. Hence, the external connection terminals 17 and the terminals 28 of the read/write board 29 can be bonded to each other with higher strength to thereby produce improved bonding reliability therebetween.

The suspension board with circuit 11 of the present invention may be so modified, as shown in FIGS. 16–18, that the external connection terminals 17 may be substantially formed by the conductive layer 14 and the pad portions 19 formed on the conductive layer 14 exposed by opening the cover layer 18, with the suspension board 12 and the base layer 13 being opened in their portions in which the external connection terminals 17 are to be formed. Referring to FIGS. 16 and 17, in the external connection terminals 17, the cover layer 18 is opened to have a single rectangular opening enough large to contain all the pad portions 19, and the nickel plated layer 26 and the gold plated layer 27 are formed as the pad portions 19 on the conductive layer 14 exposed in the opening. Also, the suspension board 12 and the base layer 13 are each opened, as shown in FIG. 18, to have a single rectangular opening 32 enough large to contain all the pad portions 19, and the same plated layers 35 as those of the pad portions 19 are formed on the conductive layer 14 exposed in the opening 32. It is noted that in FIGS. 16–18, the ground 20 and the thin metal film 22 are omitted.

These external connection terminals 17 can be formed as follows in the manufacturing processes of the suspension board with circuit mentioned above. For example, in the case where after the base layer 13 is formed on the suspension board 12 to define a specified pattern, as shown in FIG. 5, and then the conductive layer 14 is formed on the base layer 13 to define a specified circuit pattern, as shown in FIG. 6, the conductor layer 14 is covered with the cover layer 18, as shown in FIG. 7, the cover layer 18 is patterned to define a single, large, rectangular opening to contain all the pad portions 19, rather than a plurality of independent, generally rectangular openings separately formed in correspondence with their respective pad portions 19, in the process shown in FIG. 7(c) that a coating 18a is so patterned as to expose the conductive layer 14 in its portion in which the pad portions 19 are to be formed.

Then, in the process of forming the pad portions 19 shown in FIG. 8, the suspension board 12 is cut out into a specified shape like the gimbal 15 by a known process such as the chemical etching. In this cutting, the suspension board 12 is concurrently cut out into a single, large, rectangle shape to contain all the pad portions 19 in its portion corresponding to the pad portions 19, to thereby form openings 32, as shown in FIG. 19(a). Sequentially, the thin metal film 22 exposed by opening the cover layer 18 in its portion in which the pad portions 19 are to be formed is peeled off, as shown in FIG. 19(b). At the same time as this peeling, the thin metal film 22 formed on the suspension board 12 is also peeled off.

Then, as shown in FIG. 19(c), the base layer 13 exposed in the opening 32 formed by cutting out the suspension board 12 is opened in correspondence with the opening 32. (The opening of the cover layer 18 thus formed also forms the opening 32.) The opening of the base layer 13 can be formed by use of a known method such as plasma etching or laser processing. Thereafter, the ground 20 exposed by opening the base layer 13 is peeled off and thereby a back surface of the conductive layer 14 opposite to the front surface of the same on which the pad portions 19 is to be formed is exposed, as shown in FIG. 19(d). Then, the pad portions 19 are formed on the front surface of the exposed conductive layer 14 by plating and simultaneously the same plated layers 35 are formed on both side surfaces and the back surface of the exposed conductive layer 14, as shown in FIG. 19(e). The pad portions 19 and the plated layers 35 can both be formed by forming the gold plated layer 27 on the nickel plated layer 26 by performing the electrolysis nickel plating and the electrolysis gold plating in sequence in the same manner as in the above. Finally, the plating leads used in the electrolysis nickel plating and the electrolysis gold plating are removed by the chemical etching to thereby produce the suspension board with circuit 11. The matters to which no reference is given in the above-mentioned description depends on the examples mentioned above.

In the suspension board with circuit 11 thus produced, its portions in which the external connection terminals 17 are formed are left bare of the suspension board 12 and the base layer 13. For example in the case where the external connection terminals 17 are bonded to the terminals 28 of the read/write board 29, as shown in FIG. 16, for example when supersonic vibration (which is indicated by an arrow 34 in FIG. 16) or equivalent is applied from the outside of the plated layers 35, the supersonic vibration is transmitted from the plated layers 35 to the pad portions 19 through the conductive layer 14, without passing through the suspension board 12 and the base layer 13. Thus, the vibration is transmitted to the pad portions 19 with little damped vibration. Hence, the external connection terminals 17 and the terminals 28 of the read/write board 29 can be bonded to each other with higher strength to thereby produce improved bonding reliability therebetween. When compared with the suspension board with circuit 11 shown in FIGS. 2–4 and the suspension board with circuit 11 shown in FIGS. 11–13, the suspension board with circuit 11 shown in FIGS. 16–18 is left bare of both the suspension board 12 and the base layer 13, so that the supersonic vibration is transmitted with further efficiency, thus producing further improved bonding strength. In the suspension board with circuit 11 shown in FIGS. 16–18, the pad portions 19 and the plated layers 35 need not be particularly distinguished from each other. For example, the terminals 28 of the read/write board 29 may be bonded to the plated layer 35, rather than to the pad portions 19.

While the suspension board with circuit 11 of the respective embodiment mentioned above is the so-called long tail type one in which the external connection terminals 17 are bonded to the terminals 28 of the read/write board 29, the suspension board with circuit of the present invention need not be limited thereto. For example, it may be the so-called short tail type one, as shown in FIG. 20. In the short tail type of suspension board with circuit 11, the suspension board with circuit 11 is connected to the read/write board 29 through an intermediate board 30 and the external connection terminals 17 of the suspension board with circuit 11 is connected to terminals 31 of the intermediate board.

While in the aforesaid embodiments, the pad portions 19 of the external connection terminals 17 are formed by plating, they may be formed by any other known process, without limiting to the plating. The pad portions 19, the openings 32 and the cut-out portions 33 may be formed into a circular shape or a polygonal shape without limiting to the rectangular shape. The shapes thereof may be properly selected in accordance with the intended purposes and intended uses.

The external connection terminals 17 of the suspension board with circuit 11 in the respective embodiment mentioned above have a flat form which is superior in impedance characteristic to a bump-like form of the external connection terminals of the conventional suspension board with circuit. The external connection terminals 17 of the flat form in the suspension board with circuit 11 of the respective embodiment mentioned above are bonded to the terminals 28 of the read/write board 29 in a plane-to-plane relation, so that variation in shape in the nodes is small, as compared with those of the bump-like form, and thus variation in impedance in the nodes is small. Therefore, signals can well be transmitted therebetween. This impedance characteristic can be evaluated, for example, by using Time Domain Reflectometry.

Also, the bonding of the external connection terminals 17 to external circuit such as the terminals 28 of the read/write board 29 may be performed by any known bonding process, such as a hot-press-contact process, without limiting to the supersonic vibration applying process.

EXAMPLES

While in the following, the present invention will be described in further detail with reference to Examples and Comparative Examples, the present invention is not limited to any Examples and Comparative Examples.

Example 1

Liquid solution of polyamic acid resin was applied on the stainless foil having thickness of 25 µm and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned with the negative image. Sequentially, the patterned coating of polyamic acid resin was heated at 350° C. to be cured (imidized), whereby the base layer made of polyimide of thickness of 15 µm was formed with the specified pattern.

Sequentially, a thin chrome film of thickness of 300 Å and a thin copper film of thickness of 700 Å were formed in sequence on the entire surface of the stainless foil and the base layer by the sputtering deposition process. Thereafter, the plating resist having the opposite pattern to the specified circuit pattern was formed by use of the dry film resist, and the conductive layer having the specified circuit pattern was formed in the part of the base layer where the plating resist was not formed, by the electrolysis copper plating. Thereafter, the plating resist was removed by the chemical etching and then the thin chrome film and thin copper film on which the plating resist was formed were removed by the chemical etching. The conductive layer had thickness of 20 µm and was formed to have the pattern defined by four lines of wire each having width of 20 µm with spaced apart in parallel at interval of 30 µm.

Sequentially, a hard, thin nickel film having thickness of 0.1 µm was formed on the surface of the conductive layer and the surface of the stainless foil by the electroless nickel plating. Thereafter, liquid solution of polyamic acid resin was applied on the thin nickel film and the base layer and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned so that the conductive layer could be covered with the coating. Sequentially, the patterned coating of polyamic acid resin was heated at 350° C. to be cured (imidized), whereby the cover layer formed of polyimide of thickness of 3 µm was formed on the conductive layer. When the cover layer was formed, the cover layer was kept from covering the conductive layer at the portion thereof where the pad portions of the magnetic head connection terminals and external connection terminals were to be formed.

Thereafter, the thin nickel film formed on the stainless foil and the thin nickel film formed on the conductive layer at the portion thereof where the pad portions of the magnetic head connection terminals and external connection terminals were to be formed were peeled off. Thereafter, that corresponding portion where the pad portions were to be formed was subjected to the electrolysis nickel plating and the electrolysis gold plating in sequence to thereby form the nickel plated layer having thickness of 2 µm and the gold plated layer having thickness of 1 µm to thereby produce the pad portions. Then, lead wires used in the electrolysis nickel plating and the electrolysis gold plating were removed by the chemical etching. Thereafter, the stainless foil was cut out into a specified shape by the chemical etching. In this cut-out process, the stainless foil was opened in rectangular shape at its separate portions corresponding to the pad portions concurrently. Then, it was washed and dried to produce the suspension board with circuit.

The suspension board with circuit of Example 1 corresponds in external connection terminal to the embodied form shown in FIGS. 2–4.

Example 2

The suspension board with circuit was produced in the same operation as in Example 1, except that when the stainless foil was cut out by the chemical etching, it was opened to form a single, large, rectangular opening to contain all the pad portions, rather than was opened in its portions corresponding to the pad portions separately.

The suspension board with circuit of Example 2 corresponds in external connection terminal to the embodied form shown in FIGS. 9 and 10.

Example 3

Liquid solution of polyamic acid resin was applied on the stainless foil having thickness of 25 µm and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned with the negative image. In this patterning process, the coating was kept from being formed at its portions where the pad portions of the external connection terminals were formed. Sequentially, the patterned coating of polyamic acid resin was heated at 350° C. to be cured (imidized), whereby the base layer made of polyimide of thickness of 15 µm was formed with the specified pattern.

Sequentially, a thin chrome film of thickness of 300 Å and a thin copper film having thickness of 700 Å were formed in sequence on the entire surface of the stainless foil and the base layer by the sputtering deposition process. Thereafter, the plating resist having the opposite pattern to the specified circuit pattern was formed by use of the dry film resist. Then, the conductive layer was formed on the base layer at its portion where the plating resist was not formed and on the stainless foil at its portion exposed from the base layer. (or at its portion where the pad portions were to be formed) in the form of the specified circuit pattern by the electrolysis copper plating. Thereafter, the plating resist was removed by the chemical etching and then the thin chrome film and thin copper film on which the plating resist was formed were removed by the chemical etching. The conductive layer had thickness of 20 µm and was formed to have the pattern defined by four lines of wire each having width of 20 µm with spaced apart in parallel at interval of 30 µm.

Sequentially, a hard, thin nickel film having thickness of 0.1 µm was formed on the surface of the conductive layer and the surface of the stainless foil by the electroless nickel plating. Thereafter, liquid solution of polyamic acid resin was applied on the thin nickel film and the base layer and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned so that the conductive layer could be covered with the coating. Sequentially, the patterned coating of polyamic acid resin was heated at 350° C. to be cured (imidized), whereby the cover layer formed of polyimide of thickness of 3 µm was formed on the conductive layer. In the forming of the cover layer, the cover layer was kept from covering the conductive layer at the portion thereof where the pad portions of the magnetic head connection terminals and external connection terminals were to be formed.

Thereafter, the thin nickel film formed on the stainless foil and the thin nickel film formed on the conductive layer at the portion thereof where the pad portions of the magnetic head connection terminals and external connection terminals were to be formed were peeled off. Thereafter, that portion where the pad portions were to be formed was subjected to the electrolysis nickel plating and the electrolysis gold plating in sequence to thereby form the nickel plated layer having thickness of 2 µm and the gold plated layer having thickness of 5 µm to thereby produce the pad portions. Then, lead wires used in the electrolysis nickel plating and the electrolysis gold plating were removed by the chemical etching. Thereafter, the stainless foil was cut out into a specified shape by the chemical etching. In this cut-out process, the stainless foil was opened in rectangular shape around its separate portions corresponding to the pad portions concurrently to thereby form the cut-outs. Then, it was washed and dried to produce the suspension board with circuit.

The suspension board with circuit of Example 3 corresponds in external connection terminal to the embodied form shown in FIGS. 11–13.

Example 4

Liquid solution of polyamic acid resin was applied on the stainless foil having thickness of 25 µm and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned with the negative image. Sequentially, the patterned coating of polyamic acid resin was heated at 350° C. to be cured (imidized), whereby the base layer made of polyimide of thickness of 10 µm was formed with the specified pattern.

Sequentially, a thin chrome film of thickness of 300 Å and a thin copper film of thickness of 700 Å were formed in sequence on the entire surface of the stainless foil and the base layer by the sputtering deposition process. Thereafter, the plating resist having the opposite pattern to the specified circuit pattern was formed by use of the dry film resist. Then, the conductive layer having the specified circuit pattern was formed on the base layer at its portion where the plating resist was not formed by the electrolysis copper plating. Thereafter, the plating resist was removed by the chemical etching and then the thin chrome film and thin copper film on which the plating resist was formed were removed by the chemical etching. The conductive layer had thickness of 10 µm and was formed to have the pattern defined by four lines of wire each having width of 100 µm with spaced apart in parallel at interval of 500 µm.

Sequentially, a hard, thin nickel film having thickness of 0.1 µm was formed on the surface of the conductive layer and the surface of the stainless foil by the electroless nickel plating. Thereafter, liquid solution of polyamic acid resin was applied on the thin nickel film and the base layer and then heated at 130° C. to thereby form a coating of polyamic acid resin. Sequentially, the coating was exposed to light (405 nm, 1,500 mJ/cm$^2$) through the photomask. The exposed part was heated to 180° C. and then developed by using alkaline developer, whereby the coating was patterned so that the conductive layer could be covered with the coating. Sequentially, the patterned coating of polyamic acid resin was heated at 350° C. to be cured (imidized), whereby the cover layer formed of polyimide of thickness of 3 µm was formed on the conductive layer. In the forming of the cover layer, the cover layer was kept from covering the conductive layer at the portion thereof where the pad portions of the magnetic head connection terminals and external connection terminals were to be formed. The cover layer is formed to have a single, large, rectangle-shaped opening to contain all the pad portions, particularly at its portion where the pad portions of the external connection terminals were to be formed.

Sequentially, the stainless foil was cut out into a specified shape by the chemical etching. In this cut-out process, the stainless foil was cut out into a single, large, rectangular form to contain all the pad portions at its portion corresponding to the, respective pad portions concurrently to thereby form the opening. Thereafter, the thin nickel film formed on the stainless foil and the thin nickel film formed on the conductive layer at the portion thereof where the pad portions of the magnetic head connection terminals and external connection terminals were to be formed were peeled off. Thereafter, the base layer exposed in the opening formed by cutting out the stainless foil was opened in correspondence with the opening by laser processing. Thereafter, the thin chrome film and the thin copper film exposed by opening the base layer were peeled off by the chemical etching and thereby the back surface of the conductive layer opposite to the front surface of the same on which the pad portions were to be formed was exposed. Then, the front surface of the conductive layer was subjected to the electrolysis nickel plating and the electrolysis gold plating in sequence to thereby form the nickel plated layer having thickness of 2 $\mu$m and the gold plated layer having thickness of 1 $\mu$m to thereby produce the pad portions. Simultaneously, the same plated layers were formed on the both side surfaces of and the back surface of the exposed conductive layer. Finally, lead wires used in the electrolysis nickel plating and the electrolysis gold plating were removed by the chemical etching to thereby produce the suspension board with circuit.

The suspension board with circuit of Example 4 corresponds in external connection terminal to the embodied form shown in FIGS. 16–18.

Comparative Example 1

The suspension board with circuit was produced in the same operation as in Example 1, except that when the stainless foil was cut out into the specified form by the chemical etching, the stainless foil was not opened at its portions corresponding to the pad portions.

The suspension board with circuit of Comparative Example 1 corresponds in external connection terminal to the embodied form shown in FIG. 21.

EVALUATION

1) Production of board to be bonded:

The board shown in FIG. 22 was produced as a board to be bonded. The board to be bonded shown in FIG. 22 was produced as follows. The base layer 42 formed of polyimide having thickness of 10 $\mu$m was laminated on the suspension board 41 formed of stainless foil having thickness of 25 $\mu$m. Then, the conductive layer 43 formed of copper having thickness of 10 $\mu$m was formed on the base layer 42 in the form of four lines of wire, and the nickel plated layer 44 having thickness of 2 $\mu$m and the gold plated layer 45 having thickness of 5 $\mu$m were formed in sequence on an end portion of the each line of wire, whereby four connection terminals 46 were formed.

2) Bonding between suspension board with circuit and board to be bonded:

After the surface of the gold plated layer of the four pad portions of the external connection terminals of the suspension board with circuit in each of Examples 1–4 and Comparative Example 1 was set in alignment with the four connection terminals of the board to be bonded, the both boards were bonded to each other with a bonding tool of a supersonic vibration bonder abutted from the rear side of the suspension board with circuit at the pad portions thereof. The bonding conditions are as follows.

Supersonic vibration bonder: Type 260 available from ANZA Corp.
Temperature: Room temperature
Output of supersonic vibration: 3.0 W
Load: 200 gf (1.96 N)
Time: 400 ms.

3) Peel test:

Bonding characteristic between the terminals was evaluated by performing a 90 degree peel test. In the 90 degree peel test, in the state in which the board to be bonded was fixed to a horizontal fixing plate via adhesive and the suspension board with circuit was bent upwardly at 90 degree, the suspension board with circuit was chucked at its end opposite to the bonded side and pulled as shown in FIG. 23. The measurement conditions are as follows. The result is shown in TABLE 1 given below. In TABLE 1, "Breakage mode A" indicates breakage of board which indicates a good bonding characteristic and "Breakage mode B" indicates peeling of pad which indicates a inferior bonding characteristic. "Bonding strength" indicates strength per terminal.

Tensile strength testing machine: MOLEL 1011/MODEL 1321DW available from AIKOH ENGINEERING
Peel rate: 10 mm/min.

TABLE 1

| Number of Samples (N) | Example 1 | | Example 2 | | Example 3 | | Example 4 | | Comparative Example 1 | |
| --- | --- | --- | --- | --- | --- | --- | --- | --- | --- | --- |
| | Bonding strength (mN) | Breakage mode | Bonding strength (mN) | Breakage mode | Bonding strength (mN) | Breakage mode | Bonding strength (mN) | Breakage mode | Bonding strength (mN) | Breakage mode |
| 1 | 1,176 | A | 1,196 | A | 1,136 | A | 1,270 | A | 138 | B |
| 2 | 1,098 | A | 744 | B | 1,274 | A | 1,255 | A | 118 | B |
| 3 | 1,156 | A | 1,136 | A | 1,176 | A | 1,268 | A | 196 | B |

TABLE 1-continued

|  | Example 1 | | Example 2 | | Example 3 | | Example 4 | | Comparative Example 1 | |
| --- | --- | --- | --- | --- | --- | --- | --- | --- | --- | --- |
| Number of Samples (N) | Bonding strength (mN) | Breakage mode | Bonding strength (mN) | Breakage mode | Bonding strength (mN) | Breakage mode | Bonding strength (mN) | Breakage mode | Bonding strength (mN) | Breakage mode |
| 4 Average value | 764 1,048.5 | B | 1,176 1,063.0 | A | 1,216 1,200.5 | A | 1,281 1,268.5 | A | 176 157.0 | B |

It is clearly seen from TABLE 1 that the suspension board with circuit of each of Examples 1–4 has high bonding strength showing good bonding characteristic, as compared with the suspension board with circuit of Comparative Example 1.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A suspension board with circuit comprising a metal supporting layer, an insulating layer formed on said metal supporting layer, a conductive layer formed on said insulating layer in the form of a specified circuit pattern, said suspension board with circuit having a terminal portion for connecting said circuit with an external circuit, wherein said terminal portion comprises a portion of said suspension board at which said circuit pattern of said conductive layer is to be connected with said external circuit, wherein said metal supporting layer and/or said insulating layer is provided with an opening at said portion of said suspension board at which said circuit pattern of said conductive layer is to be connected with said external circuit.

2. The suspension board with circuit according to claim 1, wherein said terminal portion comprises said insulating layer, a portion of said conductive layer at which said circuit pattern is to be connected with said external circuit, said portion of said conductive layer being formed on said insulating layer, and a pad portion formed by plating on said portion of said conductive layer.

3. The suspension board with circuit according to claim 1, wherein said terminal portion comprises said metal supporting layer, a portion of said conductive layer at which said circuit pattern is to be connected with said external circuit, said portion of said conductive layer being formed on said metal supporting layer, and a pad portion formed by plating on said portion of said conductive layer.

4. The suspension board with circuit according to claim 1, wherein said terminal portion comprises a portion of said conductive layer at which said circuit pattern is to be connected with said external circuit and a pad portion formed by plating on said portion of said conductive layer.

* * * * *